United States Patent
Fujimoto

[11] Patent Number: 5,952,842
[45] Date of Patent: Sep. 14, 1999

[54] TEST HEAD COOLING SYSTEM

[75] Inventor: Akihiro Fujimoto, Meiwa-mura, Japan

[73] Assignee: Advantest Corp., Tokyo, Japan

[21] Appl. No.: 08/989,801

[22] Filed: Dec. 12, 1997

Related U.S. Application Data

[62] Division of application No. 08/813,697, Mar. 7, 1997, Pat. No. 5,767,690, which is a division of application No. 08/577,754, Dec. 22, 1995, Pat. No. 5,644,248.

[30] Foreign Application Priority Data

Dec. 22, 1994 [JP] Japan ................................. 6-336078

[51] Int. Cl.⁶ ........................................................ G01R 1/32
[52] U.S. Cl. .............................................. 324/760; 324/158.1
[58] Field of Search ............................ 324/760, 765, 324/158.1, 73.1, 754; 165/80.3, 80.4, 80.5; 361/702, 714, 718

[56] References Cited

U.S. PATENT DOCUMENTS

| | | | |
|---|---|---|---|
| 4,880,050 | 11/1989 | Nakamura et al. | 165/41 |
| 4,962,444 | 10/1990 | Niggeniann | 165/80.4 |
| 5,153,815 | 10/1992 | Suzuki et al. | 165/80.3 |

*Primary Examiner*—Vinh P. Nguyen
*Attorney, Agent, or Firm*—Muramatsu & Associates

[57] ABSTRACT

The present invention provides a test head cooling system for cooling test heads of a semiconductor IC test apparatus in an enclosed structure. A sealed housing is provided in a test head wherein an air duct is formed in a wall of the sealed box so that cooling air flow effectively. Several thousands of cables are connected to sockets of a plurality of boards. The boards are fixed in board racks by inserting the boards to sockets of the board racks. Gaps between the boards are arranged to provide good ventilation. Two heat exchangers are for circulating cooling medium. A flexible hose for circulating the cooling medium is connected to one of the heat exchangers. The flexible hose is connected to an outside cooling apparatus so as to freely control the temperature of the cooling medium circulating inside the heat exchanger.

7 Claims, 3 Drawing Sheets

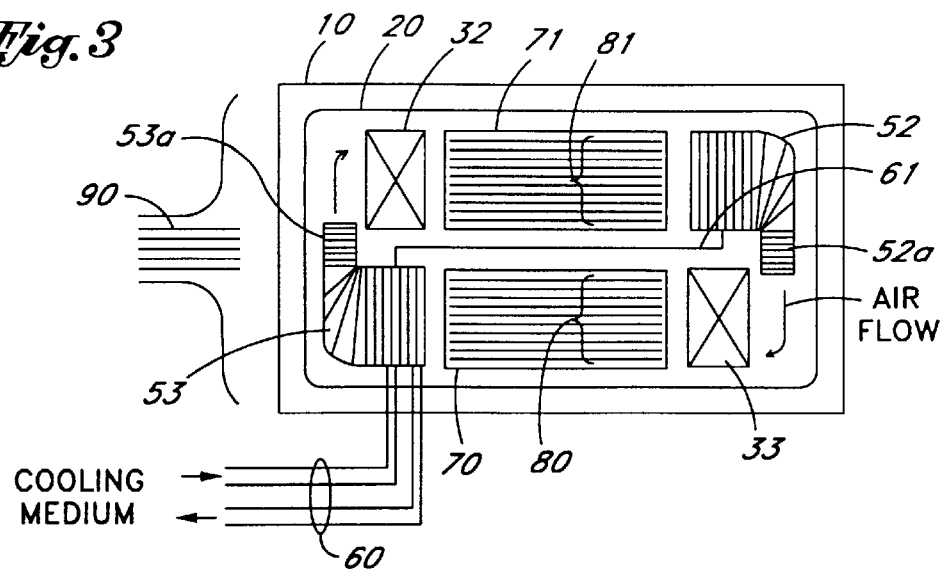
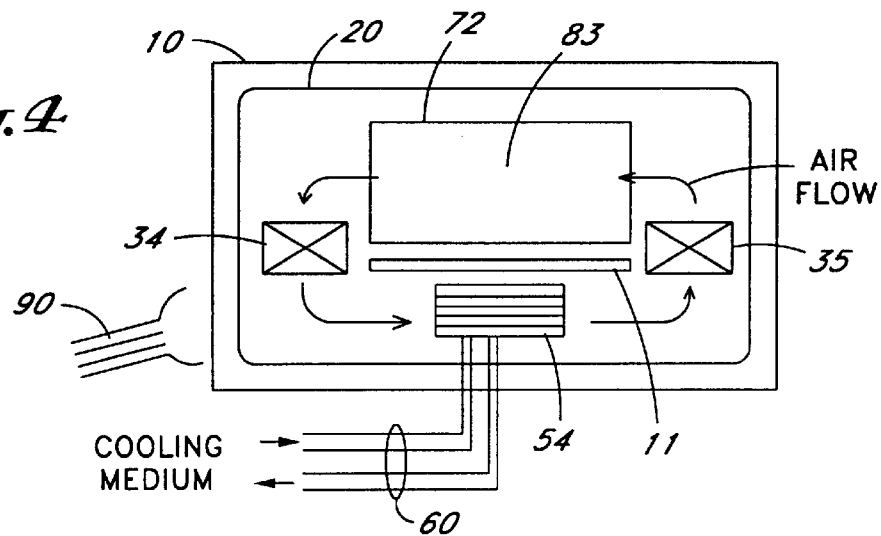
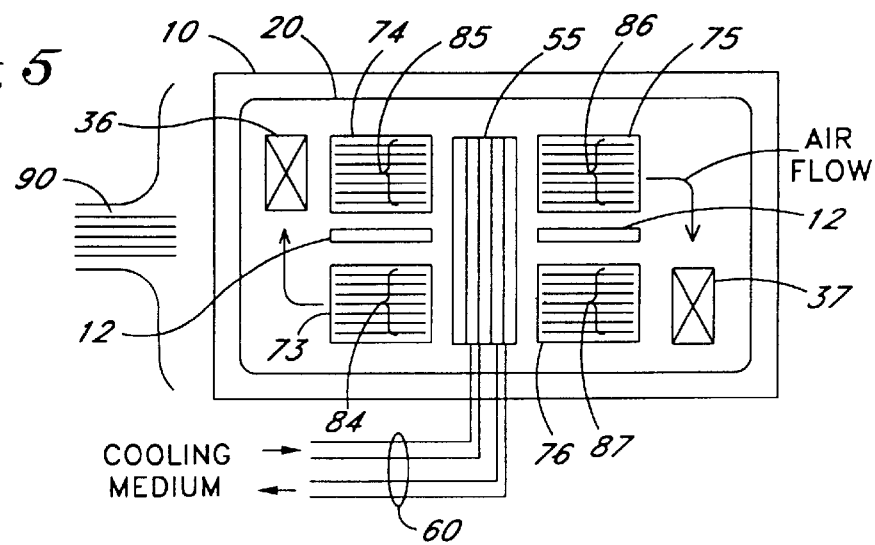

TEST HEAD COOLING SYSTEM

This is a divisional application of U.S. patent application Ser. No. 08/813,697 filed Mar. 7, 1997 (now U.S. Pat. No. 5,767,690) which is a divisional application of U.S. patent application Ser. No. 08/577,754 filed Dec. 22, 1995 (now U.S. Pat. No. 5,644,248).

FIELD OF INVENTION

The present invention relates to a test head cooling system for cooling test heads of a semiconductor IC tester in a sealed structure.

BACKGROUND OF THE INVENTION

A test head is a very important part of a semiconductor IC tester (hereinafter tester) which is connected with the tester by means of thousands of cables to test a semiconductor device (hereinafter DUT) supplied thereto.

The test head usually contains several tens of circuit boards (hereinafter board(s)) consisting of ICs and other electronic parts. When the boards loading the ICs and electronic parts are in operation, they generate a great amount of heat. For instance, when the room temperature is 20° C., the temperature inside the housing of the test head rises up to 40° C. even if a built-in fan of the test head operated to cool off inside the housing.

In general, the electronic parts such as ICs loaded on the boards are very sensitive to temperature changes in that some functions such as delay time of ICs are easily affected by such changes. Thus, it is desirable that the changes of the room temperature should be minimized.

Moreover, when the inner temperature of the housing of the test head becomes too high, it causes the high defect rate of the boards, requiring replacement of the boards, adversely affects the reliability of the tester.

In addition, the test head is relatively heavy, for instance, it weighs 200 Kg. Thus, it is a very difficult and tiresome task to replace the boards.

An example of conventional technology is explained with reference to FIGS. 6 and 7. FIG. 6 is a partially cut-away plan view showing the inside of the test head housing. FIG. 7 is a partially cut-away side view showing the inside of the test head housing.

Inside of the test head housing is arranged to be cooled by a forced air cooling system by a room temperature of a room where the tester is located. A bundle of cables 90 is connected to sockets of boards 80 and 81 in a housing 9 of the test head. The boards 80 and 81 are inserted to board racks 70 and 71. The board rack 70 is positioned between fans 38 and 39. Similarly, the board rack 71 is positioned between fans 40 and 41.

In the conventional example, first, the fan 38 generates an air flow by drawing air at the room temperature in the room where the tester is located. Then, the air generated by the fan 38 cools the boards 80 mounted in the board rack 70, wherein the fan 39 blows out the air warmed by the boards 80. In a similar manner, the fan 40 generates an air flow by drawing air. Then, the air generated by the fan 40 cools the boards 81 mounted in the board rack 71, wherein the fan 41 blows out the air.

In order to improve the reliability of the test head, the junction temperature of the IC devices mounted on the boards needed to be low.

In addition, it is necessary to maintain the inner temperature of the test head and the junction temperature of the IC devices constant and not be affected by the temperature change of the outside atmosphere.

Particularly, if the temperature inside the test head greatly changes, for instance, more than 3° C., a calibration operation for adjusting delay times throughout the system is required. As a result, a test through-put of the tester is lowered, causing a low test efficiency.

Thus, there is a need in the industry to freely control the temperature in the housing of the test head in a range of, for instance, ±1° C.

The recent advancement of technology has realized a high density structure wherein a large number of boards are mounted in the test head. However, the advanced technology has also revealed a problem that the temperature inside the test head cannot effectively be controlled by the conventional technology.

SUMMARY OF THE INVENTION

It is an object of the present invention to provide a test head sealed housing cooling system having heat interchangers and fans to keep the control temperature in the housing within the range of ±1° C.

In achieving the above object, the test head housing is sealed and connected to a flexible hose which circulates the cooling medium to the heat interchangers. The board racks and the heat exchangers are provided in the sealed housing. It is constructed in such a way that the cooling air hits the board racks after passing through the heat interchangers. An air duct is provided in the sealed test head housing so that the cooled air flows effectively. The cooling medium circulating in the heat interchangers is supplied by an outside cooling apparatus wherein its temperature is controlled freely.

BRIEF DESCRIPTION OF THE DRAWINGS

FIG. 3 is a partially cut-away plan view showing a second embodiment of the present invention.

FIG. 4 is a partially cut-away side view showing a third embodiment of the present invention.

FIG. 5 is a partially cut-away plan view showing a fourth embodiment of the present invention.

DETAILED DESCRIPTION OF THE PREFERRED EMBODIMENT

The first preferred embodiment of the present invention is explained in reference to the drawings.

Figure 1:
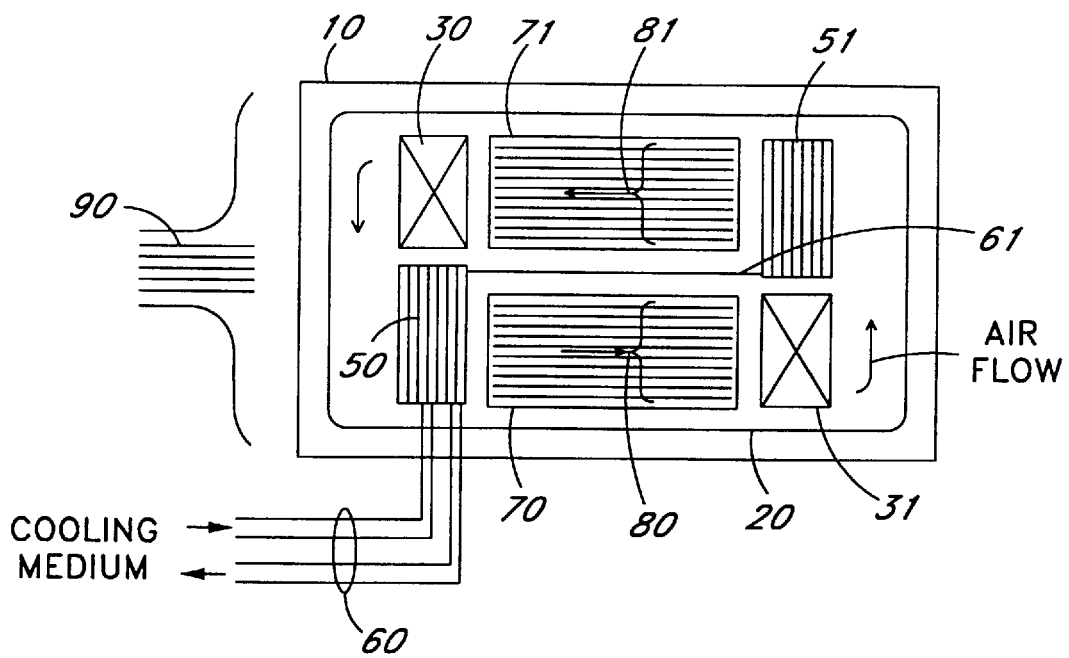
FIG. 1 is a partially cut-away plan view showing a first embodiment of the present invention.
Figure 2:
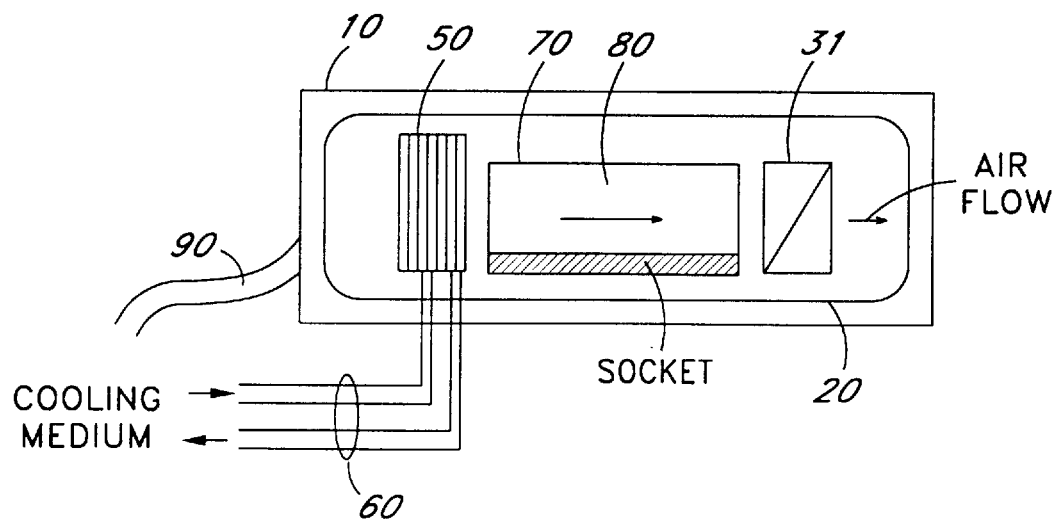
FIG. 2 is a partially cut-away side view showing the first embodiment of the present invention.
Figure 6:
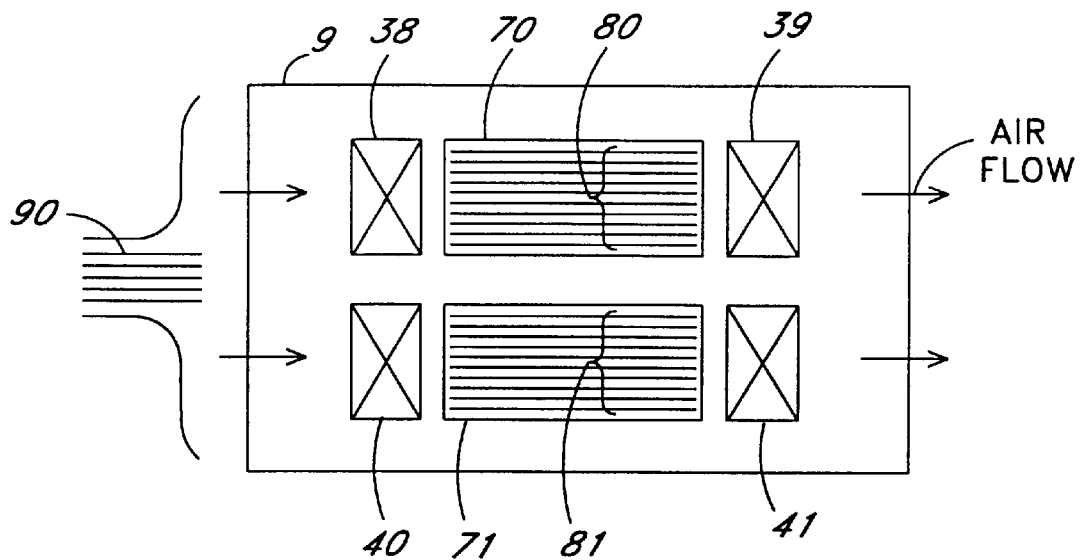
FIG. 6 is a partially cut-away plan view showing an embodiment of the conventional invention.
Figure 7:
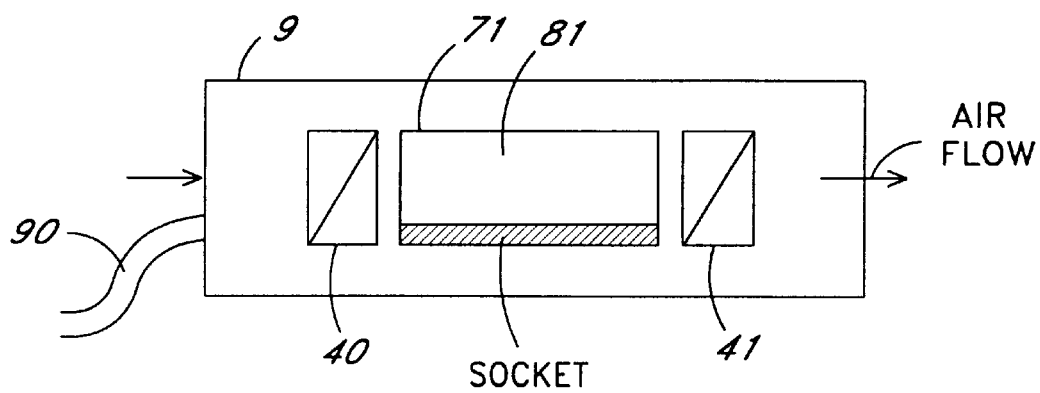
FIG. 7 is a partially cut-away side view showing an embodiment of the conventional invention.

FIGS. 1 and 2 are plan and side views respectively showing the partially cut-away views of the test head sealed housing cooling system of the present invention.

A reference numeral 10 is a sealed housing. An air duct 20 is provided so that the cooled air flows effectively through an inside wall of the sealed housing 10.

Several thousands of cables 90 are connected to the sockets of a plurality of boards 80 and 81. The boards 80 and 81 are inserted in sockets of board racks 70 and 71 and fixed thereby. The gap between the boards 80 and 81 is constructed to have good ventilation.

A cooling pipe 61 is connected to heat exchangers 50 and 51 so as to circulate the cooling medium. The heat exchanger 50 is connected to a flexible hose 60 for circulating the cooling medium. The flexible hose 60 is connected to an outside cooling device so as to freely control the temperature of the cooling medium circulating in the heat exchanger 50.

A cooling air flow generated by a fan 30 passes through the air duct 20 and further passes the heat exchanger 50 for cooling the boards 80. Further, a cooling air flow generated by a fan 31 passes through the air duct 20 and further passes the heat exchanger 51 for cooling the boards 81. As a result, the cooling air thoroughly circulates inside the sealed box 10.

In the present invention, liquid or gaseous substances such as water or freon are used as the cooling medium supplied to the heat exchanger 50.

The temperature control for the sealed box can be performed for the cooling medium itself. Moreover, the temperature control for the sealed box can be performed by controlling the flow of the cooling medium while monitoring the air temperature.

The temperature of the cooling medium can be set up at a room temperature as in the conventional technology or at a very low temperature as 0° C.

Next, the second preferred embodiment is described in the following in reference to FIG. 3. FIG. 3 is a plan view showing a partial cutaway view of the test head sealed cooling system.

As same as the first embodiment, the sealed housing 10 is provided in the second preferred embodiment. The air duct 20 is provided so that the cooled air flows effectively through the inside wall of the sealed box 10.

The several thousands of cables 90 are connected to the sockets of a plurality of boards 80 and 81. The boards 80 and 81 are inserted in sockets of the board racks 70 and 71 and fixed thereby. The gap between the boards 80 and 81 is constructed to have good ventilation.

Heat exchangers 52 and 53 having good ventilation each other are provided in the sealed housing 10. The heat exchanges 52 and 53 respectively have air guides $52_a$ and $52_b$ which guide the cooling air circulate in the housing 10 effectively. The cooling pipe 61 is connected to the heat exchangers 52 and 53 for circulating the cooling medium. The heat exchanger 53 is connected to the flexible hose 60 for circulating the cooling medium. The flexible hose 60 is connected to an outside cooling device so as to freely control the temperature of the cooling medium circulating in the heat exchanger 53.

After passing the heat exchanger 52, a cooling air flow is directed by a fan 33 and passes through the air duct 20 for cooling the boards 80. After passing a heat exchanger 53, the cooling air flow is directed by a fan 32 and passes through the air duct 20 for cooling the boards 81. As a result, the cooling air thoroughly circulates inside the sealed housing 10.

Next, the third preferred embodiment is described in the following in reference to FIG. 4. FIG. 4 is a side view showing a partial cutaway view of the test head sealed cooling system.

As same as the first and second embodiments, the sealed housing 10 is provided in the third preferred embodiment. The air duct 20 is provided so that the cooled air flows effectively through the inside wall of the sealed housing 10. In addition, a partition board 11 is provided in the sealed housing 10. The partition board 11 can be one or more circuit board of the test head and functions as an air partition in the air duct 20 to effectuate the flow of the cooling air. The several thousands of cables 90 are connected to sockets of a plurality of boards 83 which are fixed in a board rack 72. The boards 83 are connected to sockets of the board racks 72, wherein gaps of the boards 83 are arranged to have good ventilation.

A heat exchanger 54 is connected to the flexible hose 60 for circulating the cooling medium. The flexible hose 60 is connected to an outside cooling device so as to freely control the temperature of the cooling medium circulating in the heat exchanger 54.

An air flow generated by a fan 34 becomes the cooling air after passing through the heat exchanger 54 and passes through the air duct 20. Then, the cooling air is directed by a fan 35 for cooling the boards 83. As a result, the cooling air circulates inside the sealed housing 10. As shown in FIG. 4, the partition board 11 is arranged between the board rack 72 and the heat exchanger 54 in side view to promote the vertical circulation of the cooling air.

Furthermore, the fourth preferred embodiment is described in the following in reference to FIG. 5. FIG. 5 is a plan view showing a partial cutaway view of the test head sealed cooling system.

As same as the foregoing embodiments, the sealed box 10 is provided in the fourth embodiment. The air duct 20 is provided so that the cooled air flows effectively through the inside wall of the sealed housing 10. In addition, partition boards 12 are provided in the sealed housing 10 in a manner shown in FIG. 5.

The several thousands of cables 90 are connected to sockets of a plurality of boards 84, 85, 86 and 87 which are fixed in a plurality of board racks 73, 74, 75 and 76. The boards 84, 85, 86 and 87 are connected to sockets of the board racks 73, 74, 75 and 76, wherein gaps of the boards 84, 85, 86 and 87 are arranged to have good ventilation.

A heat exchanger 55 is connected to the flexible hose 60 for circulating the cooling medium. The flexible hose 60 is connected to an outside cooling device so as to freely control the temperature of the cooling medium circulating in the heat exchanger 54.

A cooling air generated by a fan 36 cools the boards 85 and enters the heat exchanger 55. The cooling air further cools the boards 86 and passes through the air duct 20. Then, the cooling air is directed by a fan 37 to cool the boards 87. The cooling air passing through the heat exchanger 55 again, at this time, cools the boards 84. Then, the cooling air passes through the air duct 20 and enters the fan 36. The circulation of the cooling air inside the sealed housing 10 is achieved thereby. As shown in FIG. 5, since each of the partition boards 12 is arranged between the two blocks of boards in plan view, this arrangement promotes the horizontal circulation of the cooling air.

The present invention described in the foregoing has the following effects.

The present invention is able to control the temperature inside the test head box within a range of ±1° C. even if the atmospheric temperature changes. Thus, the temperature in the boards 80 and 81 can be easily controlled in the sealed box structure including the heat exchangers 50 and 51 and fans 30 and 31 thereon.

Furthermore, the flowing amount of the cooling medium circulating in the heat exchangers 50 and 51 can be adjusted. Moreover, the atmospheric temperature can be controlled within a range of ±1° C. Therefore, the junction temperature of ICs which are mounted on the boards 80 and 81 can be stabilized.

Thus, since the temperature inside the test head can be stabilized, a calibration operation for adjusting delay time throughout the system can be minimized, allowing an improved tester through-put and test efficiency.

Furthermore, since a stress applied to electric parts due to temperature changes is decreased. As a result, the high reliability can be expected.

In the present invention, liquid or gaseous substances such as water or freon can be used as the cooling medium which is supplied to the heat exchanger 50. The temperature of the cooling medium can be randomly set up.

In addition, in the present invention, it is possible to waste heat as an increased water temperature without letting the air at the high temperature escape to the outside of the test head. Therefore, it is not necessary to greatly rely on the air-conditioning system of the room.

Furthermore, the present invention can provide a dust free environment because the sealed housing 10 does not take in the outside air. In the present invention, the noise is also small due to the enclosed structure.

What is claimed is:

1. A test head cooling system, comprising:

a plurality of board racks (73, 74, 75, 76) mounted inside said test head;

a plurality of boards (84, 85, 86, 87) inserted to said sockets of said board racks (73, 74, 75, 76), said boards (84, 85, 86, 87) having a large number of electric components which generate heat;

a heat exchanger (55) provided between said board racks (73, 74, 75, 76), said heat exchanger (55) being connected to a flexible hose (60) for receiving cooling medium therethrough, said flexible hose (60) being connected to an outside cooling apparatus for circulating said cooling medium;

at least one partition (12) provided between said board racks for creating a flow path for cooling air in said test head;

at least one fan (36, 37) provided in proximity with said boards for generating a flow of said cooling air in said test head.

2. A test head cooling system as defined in claim 1, further comprising:

a sealed housing (10) which is air tightly sealed from an outer environment; and an air duct (20) provided on an inside wall of said sealed housing (10).

3. A test head cooling system as defined in claim 1, wherein said heat exchanger (55) is positioned at about the center of said test head in plan view, and a first pair of said board racks (73, 74) is positioned at one side of said heat exchanger (55) while a second pair of said board racks (75, 76) is positioned at anther side of said heat exchanger (55) in plan view.

4. A test head cooling system as defined in claim 3, wherein a first partition (12) is provided between said first pair of said board racks (73, 74) and a second partition (12) is provided between said second pair of said board racks (75, 76).

5. A test head cooling system as defined in claim 4, wherein said plurality of boards (84, 85, 86, 87) in said board racks (73, 74, 75, 76) and said first and second partitions (12) are arranged in the same direction in said test head.

6. A test head cooling system as defined in claim 5, wherein said cooling air produced by said fan (36, 37) flows in the same direction of said plurality of boards (84, 85, 86, 87) and said first and second partitions (12) in said test head.

7. A test head cooling system as defined in claim 1, further comprising a cable (90) extended from a semiconductor IC test apparatus, said cable (90) being connected to sockets of said board racks (73, 74, 75, 76) mounted inside said test head.

* * * * *